(12) United States Patent
Chakravarty et al.

(10) Patent No.: US 12,190,936 B2
(45) Date of Patent: Jan. 7, 2025

(54) SYSTEM AND METHOD FOR REFRESHING DYNAMIC RANDOM ACCESS MEMORY

(71) Applicant: NXP B.V., Eindhoven (NL)

(72) Inventors: Suhas Chakravarty, Noida (IN); James Andrew Welker, Leander, TX (US)

(73) Assignee: NXP B.V., Eindhoven (NL)

( * ) Notice: Subject to any disclaimer, the term of this patent is extended or adjusted under 35 U.S.C. 154(b) by 170 days.

(21) Appl. No.: 18/158,715

(22) Filed: Jan. 24, 2023

(65) Prior Publication Data

US 2024/0185907 A1 Jun. 6, 2024

(30) Foreign Application Priority Data

Dec. 1, 2022 (IN) ............................. 202221069488

(51) Int. Cl.
*G11C 11/00* (2006.01)
*G11C 11/406* (2006.01)
*G11C 11/4078* (2006.01)

(52) U.S. Cl.
CPC .. *G11C 11/40622* (2013.01); *G11C 11/40615* (2013.01); *G11C 11/4078* (2013.01)

(58) Field of Classification Search
CPC ......... G11C 11/40611; G11C 11/40618; G11C 5/025; G11C 11/40603; G11C 11/40615; G11C 11/40622; G11C 11/4078; G11C 11/408; G11C 2211/4062; G11C 8/12; G11C 11/54; G11C 5/04; G11C 5/063; G11C 7/1051; G11C 7/106; G11C 7/1066; G11C 7/1069; G11C 11/4087; G11C 11/4096; G11C 7/10

See application file for complete search history.

(56) References Cited

U.S. PATENT DOCUMENTS

| | | |
|---|---|---|
| 9,293,187 B2 | 3/2016 | Iyer et al. |
| 9,576,637 B1 | 2/2017 | Balakrishnan |
| 9,761,296 B2 | 9/2017 | Chang et al. |
| 10,216,658 B2 | 2/2019 | Chen et al. |
| 2016/0307619 A1 | 10/2016 | Chang et al. |
| 2017/0228175 A1 | 8/2017 | Kim |

(Continued)

OTHER PUBLICATIONS

Chang et al."Improving DRAM Performance by Parallelizing Refreshes with Access," Dec. 12, 2017, Carnegie 1 Mellon University, 13 pages.

(Continued)

*Primary Examiner* — Thong Q Le

(57) ABSTRACT

A refresh circuit selects a candidate bank for refreshing from various banks of a dynamic random access memory (DRAM). Initially, the refresh circuit checks if any bank is idle (e.g., is not targeted for memory operations). If two or more banks are idle, the candidate bank is selected based on a count of accesses targeted to each occupied bank and bank-pair distances between each pair of idle and occupied banks. Conversely, if all banks are occupied, the refresh circuit selects the candidate bank based on a count of data accesses targeted to each bank and/or a count of parity accesses targeted to each bank. Each data access has the same type as that scheduled for execution on the DRAM. Once the candidate bank is selected, the refresh circuit triggers the refresh of the candidate bank.

20 Claims, 5 Drawing Sheets

(56) References Cited

U.S. PATENT DOCUMENTS

2020/0066330 A1      2/2020   Hu et al.
2024/0112722 A1*     4/2024   Brandl .................. G11C 11/406

OTHER PUBLICATIONS

Chang et al., "Improving DRAM performance by parallelizing refreshes with accesses", 2014 IEEE 20th International Symposium on High Performance Computer Architecture (HPCA), Feb. 15-19, 2014, IEEE, Orlando, FL, USA, 12 pages.

U.S. Appl. No. 17/660,690 titled, "Data Processing System Having a Memory Controller With Inline Error Correction Code (ECC) Support," filed Apr. 26, 2022.

* cited by examiner

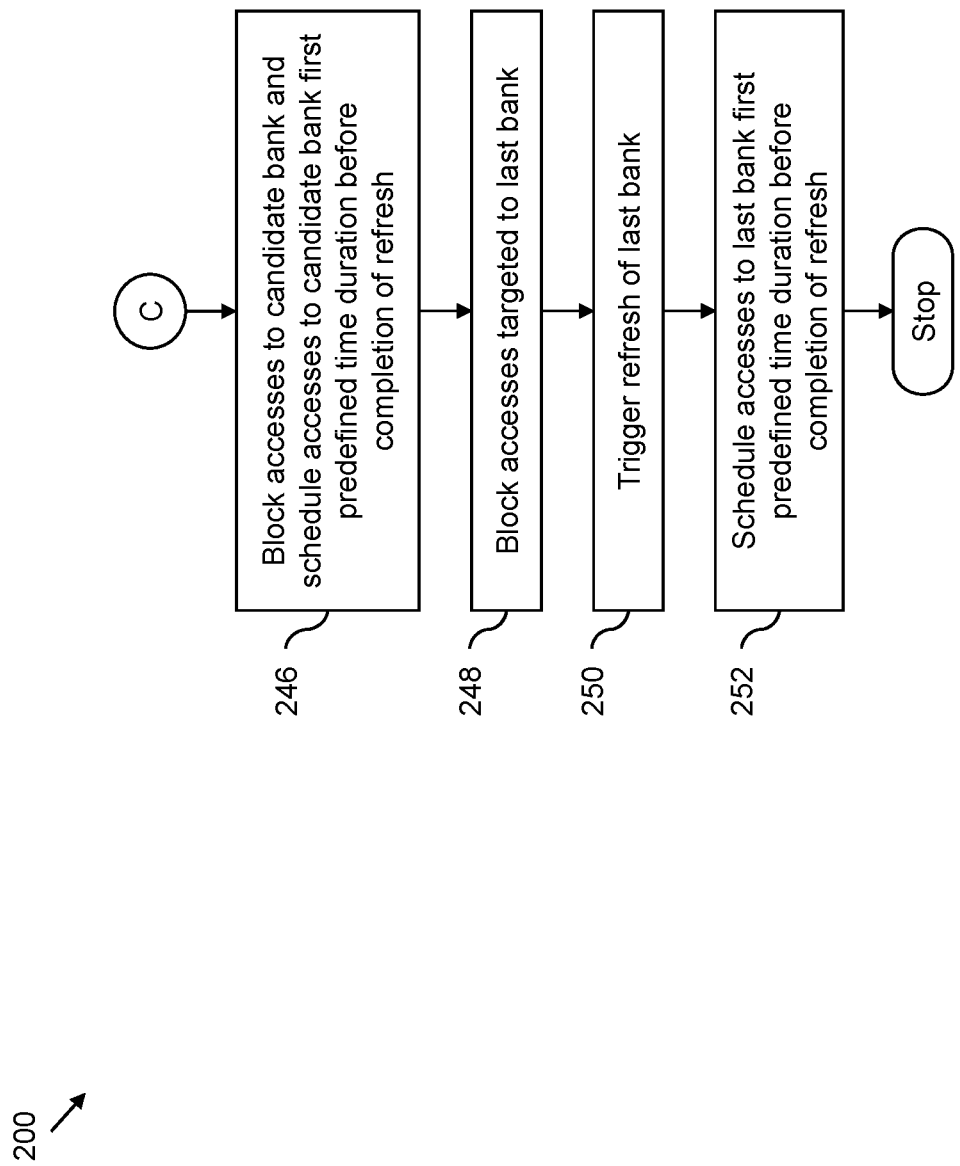

SYSTEM AND METHOD FOR REFRESHING DYNAMIC RANDOM ACCESS MEMORY

FIELD OF THE DISCLOSURE

The present disclosure relates generally to electronic circuits, and, more particularly, to a system and a method for refreshing a dynamic random access memory.

BACKGROUND

A dynamic random access memory (DRAM) is a volatile memory used extensively in electronic devices due to its low cost and simple design. The DRAM includes multiple arrays of memory storage reserves called banks. Each bank may include multiple rows (e.g., word lines) and columns (e.g., bit lines). The DRAM stores bits as charges in capacitors, with each capacitor being coupled to one bit line and one word line. However, the capacitors may leak over time and result in data loss. As a result, the DRAM requires a periodic refresh to compensate for charge leakage and maintain data integrity. Typically, all banks of the DRAM are refreshed at same time. Such a refresh is referred to as an all-bank refresh. However, when all banks are being refreshed, the DRAM is unavailable for memory operations (e.g., DRAM accesses are blocked), thereby degrading the performance (e.g., bandwidth) of the DRAM.

BRIEF DESCRIPTION OF THE DRAWINGS

The following detailed description of the embodiments of the present disclosure will be better understood when read in conjunction with the appended drawings. The present disclosure is illustrated by way of example, and not limited by the accompanying figures, in which like references indicate similar elements.

FIGS. 2A-2D, collectively, represents a flowchart that illustrates a method for refreshing a dynamic random access memory of the electronic circuit board of FIG. 1 in accordance with an embodiment of the present disclosure.

DETAILED DESCRIPTION OF EMBODIMENTS

Figure 1:
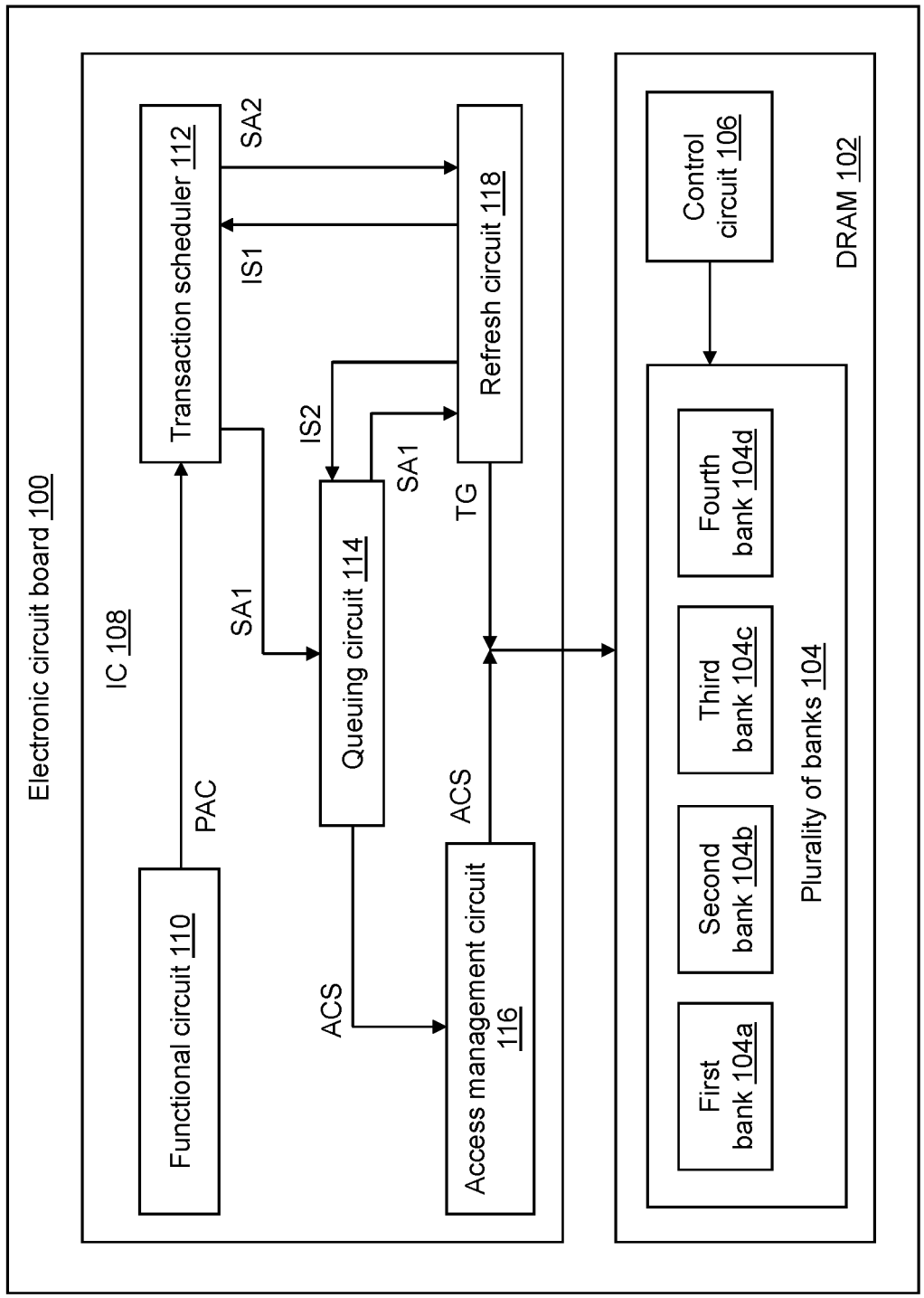
FIG. 1 illustrates a schematic block diagram of an electronic circuit board in accordance with an embodiment of the present disclosure.

The detailed description of the appended drawings is intended as a description of the embodiments of the present disclosure, and is not intended to represent the only form in which the present disclosure may be practiced. It is to be understood that the same or equivalent functions may be accomplished by different embodiments that are intended to be encompassed within the spirit and scope of the present disclosure.

In an embodiment of the present disclosure, an integrated circuit (IC) is disclosed. The IC may include a refresh circuit that may be configured to select, from a plurality of banks of a dynamic random access memory (DRAM), a candidate bank for refreshing and trigger the refresh of the candidate bank. When a first set of banks of the plurality of banks is idle and a plurality of accesses are targeted to a second set of banks of the plurality of banks, the candidate bank may be selected based on a count of accesses targeted to each of the second set of banks and a plurality of bank-pair distances. Each bank-pair distance may indicate a distance between one of the first set of banks and one of the second set of banks. Further, when at least one access is targeted to each of the plurality of banks, the candidate bank may be selected based on at least one of a group consisting of a count of data accesses targeted to each bank of the plurality of banks and a count of parity accesses targeted to each bank of the plurality of banks. A type of each data access may be same as that scheduled for execution on the DRAM.

In another embodiment of the present disclosure, a DRAM refresh method is disclosed. The DRAM refresh method may include selecting, from a plurality of banks of a DRAM, a candidate bank for refreshing by a refresh circuit. When a first set of banks of the plurality of banks is idle and a plurality of accesses are targeted to a second set of banks of the plurality of banks, the DRAM refresh method may further include determining a count of accesses targeted to each of the second set of banks and a plurality of bank-pair distances and selecting the candidate bank based on the count of accesses targeted to each of the second set of banks and the plurality of bank-pair distances. Each bank-pair distance may indicate a distance between one of the first set of banks and one of the second set of banks. When at least one access is targeted to each of the plurality of banks, the DRAM refresh method may further include determining a count of data accesses and a count of parity accesses targeted to each bank of the plurality of banks and selecting the candidate bank based on at least one of a group consisting of the count of data accesses and the count of parity accesses. A type of each data access may be same as that scheduled for execution on the DRAM. Further, the DRAM refresh method may include triggering the refresh of the candidate bank by the refresh circuit.

In yet another embodiment of the present disclosure, an IC is disclosed. The IC may include a refresh circuit that may be configured to select, from a plurality of banks of a DRAM, first through third candidate banks for refreshing and trigger the refresh of the first through third candidate banks. The first candidate bank may be selected based on a count of accesses targeted to each bank of the plurality of banks and a plurality of bank-pair distances. Each bank-pair distance may indicate a distance between a pair of banks of the plurality of banks. The second candidate bank may be selected based on a count of data accesses targeted to each bank of the plurality of banks, with a type of each data access being same as that scheduled for execution on the DRAM. Further, the third candidate bank may be selected based on a count of parity accesses targeted to each bank of the plurality of banks.

In some embodiments, the refresh circuit may be further configured to determine that the first set of banks is idle and the plurality of accesses are targeted to the second set of banks based on a count of accesses targeted to each bank of the plurality of banks. Each bank of the first set of banks is determined to be idle based on the count of accesses targeted to the corresponding bank being null. The refresh circuit may be further configured to determine a weighted value for each of the first set of banks based on a bank-pair distance between the corresponding bank and each of the second set of banks and the count of accesses targeted to each bank of the second set of banks. The candidate bank may be selected from the first set of banks based on the weighted value of each of the first set of banks.

In some embodiments, the weighted value of each bank of the first set of banks may correspond to a sum of a set of product values. Each product value may be equal to a product of the bank-pair distance between the corresponding bank and one of the second set of banks and the count of accesses targeted to the same bank of the second set of banks. The candidate bank may correspond to a bank having the weighted value greater than the weighted value of each remaining bank of the first set of banks.

In some embodiments, the refresh circuit may be further configured to identify, from the plurality of accesses, a set of parity accesses. The set of parity accesses may have a set of data accesses associated therewith. Further, from the first set of banks, the refresh circuit may be configured to identify one or more banks targeted for one or more data accesses of the set of data accesses, respectively. The bank-pair distance for each of the one or more banks of the first set of banks is null and the candidate bank is selected from remaining banks of the first set of banks.

In some embodiments, the IC may further include a queuing circuit configured to order a first set of accesses for execution on the second set of banks and a transaction scheduler configured to manage scheduling of a second set of accesses associated with the second set of banks. The plurality of accesses may correspond to at least one of a group consisting of the first set of accesses and the second set of accesses.

In some embodiments, each bank-pair distance corresponds to a circular distance, with the plurality of banks being arranged in a circular manner such that an initial bank of the plurality of banks is adjacent to a last bank of the plurality of banks.

In some embodiments, when at least one access is targeted to each of the plurality of banks, the refresh circuit may be further configured to determine a data access type scheduled for execution on the DRAM. The data access type may correspond to one of a group consisting of a read access and a write access. Further, for each bank of the plurality of banks, the refresh circuit may be configured to determine a first data count value indicating the count of data accesses having the same type as that scheduled for execution on the DRAM. The candidate bank may be selected from the plurality of banks based on the first data count value of each bank of the plurality of banks. When two or more banks of the plurality of banks are available for selection based on the corresponding first data count value, the candidate bank may be selected based on a second data count value of each of the two or more banks. The second data count value may be indicative of a count of data accesses having a different type from that scheduled for execution on the DRAM. The candidate bank may correspond to a bank having one of a group consisting of the first data count value less than the first data count value of each remaining bank of the plurality of banks and a sum of the first data count value and the second data count value less than the sum of the first data count value and the second data count value of each remaining bank of the two or more banks.

In some embodiments, when at least one access is targeted to each of the plurality of banks, the refresh circuit may be further configured to determine, for each bank of the plurality of banks, a parity count value indicating the count of parity accesses targeted thereto. The candidate bank may be selected from the plurality of banks based on the parity count value of each bank of the plurality of banks. When a set of banks of the plurality of banks is available for selection based on the corresponding parity count value, the refresh circuit may be further configured to determine a data access type scheduled for execution on the DRAM. Further, the refresh circuit may be configured to determine, for each bank of the plurality of banks, a first data count value indicating the count of data accesses having the same type as that scheduled for execution on the DRAM. The candidate bank may be selected from the plurality of banks based on the first data count value of each bank of the plurality of banks. When two or more banks, of the set of banks, are available for selection based on the corresponding first data count value, the candidate bank may be selected based on a second data count value of each of the two or more banks. The second data count value may be indicative of a count of data accesses having a different type from that scheduled for execution on the DRAM. The candidate bank may correspond to a bank having one of a group consisting of the parity count value less than the parity count value of each remaining bank of the plurality of banks, the first data count value less than the first data count value of each remaining bank of the set of banks, and a sum of the first data count value and the second data count value less than the sum of the first data count value and the second data count value of each remaining bank of the two or more banks.

In some embodiments, the transaction scheduler may be configured to manage access scheduling associated with the plurality of banks. Based on the triggering of the candidate bank for refreshing, the transaction scheduler may be further configured to block a set of accesses associated with the candidate bank, and schedule the set of accesses for execution on the candidate bank, a predefined time duration before the completion of the refresh of the candidate bank. The predefined time duration may be such that the set of accesses is available for execution on the candidate bank when the candidate bank is operational post the refresh.

In some embodiments, when the candidate bank corresponds to a penultimate bank, of the plurality of banks, to be refreshed, the transaction scheduler may be further configured to block an unscheduled set of accesses targeted to a last bank, of the plurality of banks, that is to be refreshed after the candidate bank. The queuing circuit may be configured to order a scheduled set of accesses associated with the plurality of banks. The transaction scheduler may block the unscheduled set of accesses based on at least one of a group consisting of the refresh of the last bank being due in a predefined time duration and a count of accesses targeted to the last bank in the queuing circuit being greater than a threshold value.

In some embodiments, to trigger the refresh of the candidate bank, the refresh circuit may be further configured to generate a trigger command indicative of the refresh of the candidate bank and provide the trigger command to a control circuit of the DRAM. The candidate bank may be refreshed based on the trigger command.

Overview

Conventionally, to improve the performance of a dynamic random access memory (DRAM), exclusively a single bank of the DRAM is refreshed at any instance, thereby ensuring that remaining banks of the DRAM are available for memory operations (e.g., accesses are not blocked to remaining banks). Such a refresh is referred to as a per-bank refresh. Typically, the first available/unrefreshed bank is selected for a refresh. Such selection of the banks may still result in scenarios where ongoing accesses are required to be halted as the corresponding bank is being refreshed. The selection criterion thus fails to optimally execute the refresh of the DRAM and the degradation of the performance of the DRAM persists.

Various embodiments of the present disclosure disclose an integrated circuit (IC) that includes a refresh circuit. The refresh circuit may select a candidate bank for refreshing from a plurality of banks of a DRAM. Initially, the refresh circuit may check if any of the plurality of banks are idle (e.g., memory operations are not scheduled thereon). If all the banks are idle, the middle bank is selected as the candidate bank. Further, if some banks are idle and some banks are occupied (e.g., targeted for accesses), the candidate bank is selected based on a count of accesses targeted to each occupied bank and bank-pair distances between each pair of idle and occupied banks. Conversely, if all the banks are occupied, the refresh circuit selects the candidate bank based on a count of data accesses targeted to each bank, with a type of each data access being same as that scheduled for execution on the DRAM and/or a count of parity accesses targeted to each bank. Once the candidate bank is selected, the refresh circuit may trigger the refresh of the candidate bank. Upon triggering the refresh, various accesses associated with the candidate bank are blocked and are scheduled for execution on the candidate bank, a predefined time duration before the completion of the refresh of the candidate bank. Each bank of the plurality of banks is refreshed in an aforementioned manner. When a penultimate bank is triggered for a refresh, various accesses targeted to a last bank are blocked to prevent such accesses from blocking accesses to other refreshed banks.

Thus, in the present disclosure, the candidate bank triggered for refresh is not merely the first available bank, but is selected based on various criteria. Such a selection assists in maximizing the availability of the DRAM. Thus, the performance of the DRAM of the present disclosure is significantly greater than that of a DRAM that is refreshed by way of a conventional refresh technique.

FIG. 1 illustrates a schematic block diagram of an electronic circuit board 100 in accordance with an embodiment of the present disclosure. The electronic circuit board 100 may correspond to a printed circuit board (PCB) and may be utilized in various devices such as automotive devices, networking devices, image processing devices, or the like.

The electronic circuit board 100 may include a dynamic random access memory (DRAM) 102. The DRAM 102 may be configured to store various bits therein. The DRAM 102 may include a plurality of banks 104, of which first through fourth banks 104a-104d are shown. Each bank includes various rows (e.g., word lines) and columns (e.g., bit lines) that facilitate the bit storage therein. Further, the DRAM 102 may include various capacitors (not shown), with each capacitor coupled to one bit line and one word line. Each bit of the DRAM 102 is stored as a charge in a capacitor. The DRAM 102 thus corresponds to a volatile memory. The charges in the capacitors may leak over time. Hence, the DRAM 102 is required to be periodically refreshed. As a result, the DRAM 102 may further include a control circuit 106 that may be coupled to the plurality of banks 104, and configured to execute the refresh of the plurality of banks 104. The DRAM 102 is refreshed such that exclusively a single bank is refreshed at any time instance and the remaining banks are available for memory operations. Such a refresh is referred to as the per-bank refresh. Refresh of a bank of the DRAM 102 may correspond to reading the bits stored in the bank and writing the same bits back to the bank.

The electronic circuit board 100 may further include an integrated circuit (IC) 108 that may be coupled to the DRAM 102. The IC 108 may be configured to control access to (e.g., execute memory operations on) the DRAM 102. Additionally, the IC 108 may be configured to trigger the per-bank refresh of the DRAM 102. The IC 108 may include a functional circuit 110, a transaction scheduler 112, a queuing circuit 114, an access management circuit 116, and a refresh circuit 118.

The functional circuit 110 may include suitable circuitry that may be configured to perform one or more operations. For example, the functional circuit 110 may be configured to initiate a plurality of accesses PAC for execution on the DRAM 102 (e.g., one or more banks of the plurality of banks 104). Each access may correspond to a data access (e.g., reading or writing data bits from/to the DRAM 102) or a parity access (e.g., reading or writing parity bits from/to the DRAM 102) which is followed by a data access. Examples of the functional circuit 110 may include digital signal processors, math accelerators, image processors, or the like.

The transaction scheduler 112 may be coupled to the functional circuit 110. The transaction scheduler 112 may include suitable circuitry that may be configured to perform one or more operations. For example, the transaction scheduler 112 may be configured to receive the plurality of accesses PAC from the functional circuit 110. The transaction scheduler 112 is described to receive accesses (e.g., the plurality of accesses PAC) to keep the description concise and clear and should not be considered as a limitation of the present disclosure. It will be apparent to a person skilled in the art that for each access, the functional circuit 110 may be configured to generate an access request and the generated access request may be communicated between various components of the IC 108.

The transaction scheduler 112 may be further configured to manage access scheduling associated with the plurality of banks 104. In other words, the transaction scheduler 112 may be further configured to schedule one or more accesses of the plurality of accesses PAC for execution on the DRAM 102. Thus, at any instance, some accesses of the plurality of accesses PAC may be scheduled for execution on the DRAM 102 and remaining accesses may be pending (e.g., are being managed by the transaction scheduler 112). The transaction scheduler 112 may include a buffer memory (not shown) for storing the unscheduled accesses.

The queuing circuit 114 may be coupled to the transaction scheduler 112. The queuing circuit 114 may include suitable circuitry that may be configured to perform one or more operations. For example, the queuing circuit 114 may be configured to receive the scheduled accesses (e.g., scheduled access requests) from the transaction scheduler 112 and order the received accesses for execution on the DRAM 102.

In the present disclosure, it is assumed that the transaction scheduler 112 is configured to schedule a first set of accesses SA1 of the plurality of accesses PAC for execution on the DRAM 102. In other words, the queuing circuit 114 is configured to receive the first set of accesses SA1 from the transaction scheduler 112 and order the first set of accesses SA1 for execution on the DRAM 102. The remaining (e.g., unscheduled) accesses of the plurality of accesses PAC are hereinafter referred to as a "second set of accesses SA2". The second set of accesses SA2 may be stored in the buffer memory of the transaction scheduler 112. Thus, the first set of accesses SA1 is ordered by the queuing circuit 114 and the scheduling of the second set of accesses SA2 is managed by the transaction scheduler 112.

The access management circuit 116 may be coupled to the queuing circuit 114 and the DRAM 102 (e.g., the plurality of banks 104). The access management circuit 116 may include suitable circuitry that may be configured to perform one or more operations. For example, the access management circuit 116 may be configured to receive various accesses (e.g., an access ACS) from the queuing circuit 114. The access management circuit 116 may be further configured to execute a memory operation on the DRAM 102 (e.g., a targeted bank of the plurality of banks 104) for executing the access ACS.

The refresh circuit 118 may be coupled to the queuing circuit 114, the transaction scheduler 112, and the DRAM 102 (e.g., the control circuit 106). The refresh circuit 118 may include suitable circuitry that may be configured to perform one or more operations. For example, the refresh circuit 118 may be configured to manage the per-bank refresh of the DRAM 102.

The refresh circuit 118 may be configured to monitor the queuing circuit 114 and the transaction scheduler 112. The refresh circuit 118 may thus be configured to determine that the first set of accesses SA1 is present in the queuing circuit 114 and the second set of accesses SA2 is present in the transaction scheduler 112. Each access of the first and second sets of accesses SA1 and SA2 may be targeted to a bank of the plurality of banks 104. Further, each access of the first and second sets of accesses SA1 and SA2 may correspond to a data access or a parity access. Thus, the refresh circuit 118 may be further configured to determine, for each bank of the plurality of banks 104, a first data count value indicating a count of read accesses, a second data count value indicating a count of write accesses, and a parity count value indicating a count of parity accesses targeted thereto. In an example, the parity accesses may correspond to error correction code (ECC) accesses. The refresh circuit 118 may thus be configured to determine a total access count value indicating a count of accesses targeted to each bank of the plurality of banks 104, with the total access count value of each bank corresponding to a sum of the first data count value, the second data count value, and the parity count value of each bank. The refresh circuit 118 may be further configured to select, from the plurality of banks 104 of the DRAM 102 that are to be refreshed, a candidate bank for refreshing. The criterion to be used for selecting the candidate bank depends on the occupancy status of the plurality of banks 104. The refresh circuit 118 may thus be configured to determine the occupancy status of each bank of the plurality of banks 104 based on the count of accesses targeted thereto.

All Banks are Idle:

Based on the count of accesses targeted to each bank of the plurality of banks 104, the refresh circuit 118 may determine that each bank is idle. Each bank of the plurality of banks 104 may be determined to be idle based on the count of accesses targeted to the corresponding bank being null. In such a scenario, the candidate bank corresponds to a bank that is at a center position in a linear arrangement of the plurality of banks 104. Typically, sequential access streams may spill to banks at the ends, and hence, a central bank is selected as the candidate bank in such cases. In the exemplary illustration of FIG. 1, the candidate bank may correspond to the second bank 104b or the third bank 104c.

Some Banks are Idle and Some Banks are Occupied:

The refresh circuit 118 may be further configured to determine, based on the count of accesses targeted to each bank of the plurality of banks 104, that a first set of banks of the plurality of banks 104 is idle and a second set of banks of the plurality of banks 104 is occupied (e.g., the plurality of accesses PAC are targeted to the second set of banks). Each bank of the first set of banks is determined to be idle based on the count of accesses targeted to the corresponding bank being null. In such cases, the queuing circuit 114 may order the first set of accesses SA1 for execution on the second set of banks and the transaction scheduler 112 may manage scheduling of the second set of accesses SA2 associated with the second set of banks. The candidate bank may be selected from the first set of banks in such cases. The refresh circuit 118 may be further configured to determine, for each bank of the first set of banks, a bank-pair distance between the corresponding bank and each of the second set of banks. Further, the refresh circuit 118 may be configured to determine a weighted value of each of the first set of banks. The weighted value of each of the first set of banks is determined based on the bank-pair distance between the corresponding bank and each of the second set of banks and the count of accesses targeted to each bank of the second set of banks. In an embodiment, the weighted value of each bank corresponds to a sum of a set of product values, with each product value being equal to a product of the bank-pair distance between the corresponding bank and one of the second set of banks and the count of accesses targeted to the same bank of the second set of banks. Each bank-pair distance corresponds to a circular distance, with the plurality of banks 104 being arranged in a circular manner such that an initial bank (e.g., the first bank 104a) of the plurality of banks 104 is adjacent to a last bank (e.g., the fourth bank 104d) of the plurality of banks 104.

Example

In an example, it is assumed that the first and second banks 104a and 104b are idle and the third and fourth banks 104c and 104d are occupied. Thus, first and second weighted values may be determined for the first and second banks 104a and 104b, respectively. The first weighted value may be equal to a sum of a first product value and a second product value. The first product value may be equal to a product of a bank-pair distance between the first and third banks 104a and 104c (e.g., two) and the count of accesses targeted to the third bank 104c. Similarly, the second product value may be equal to a product of a bank-pair distance between the first and fourth banks 104a and 104d (e.g., one) and the count of accesses targeted to the fourth bank 104d. The second weighted value may be determined in a similar manner. The circular distance may correspond to the clockwise and/or anti-clockwise distances. In an example, the circular distance may correspond to the shortest of the clockwise and anti-clockwise distances.

The candidate bank is selected from the first set of banks based on the weighted value of each of the first set of banks. In an embodiment, the candidate bank corresponds to a bank of the first set of banks having the highest weighted value (e.g., having the weighted value greater than the weighted value of each remaining bank of the first set of banks). However, in other embodiments, any other rule may be utilized for selecting the candidate bank from the first set of banks based on the weighted value of each of the first set of banks. If two or more banks have the highest weighted value, any of the two may be selected as the candidate bank.

In some conventional refresh techniques, when an idle bank is selected for a refresh, it is common for the selected bank to be adjacent to a bank undergoing memory operations. In such a scenario, while the selected bank is being refreshed, sequential access streams may spill from the adjacent bank to the refreshing bank, and the accesses may be halted till the refresh is complete. Further, the selection of banks is implemented in a sequential manner (e.g., after one bank is refreshed, an adjacent/closest unrefreshed bank is selected for refresh). Thus, the accesses may be continually halted during each spill to an adjacent refreshing bank, thereby degrading the DRAM performance. In the present disclosure, the candidate bank may correspond to a bank that is farthest from heavily targeted banks to mitigate performance degradation resulting from memory operation stalling during the sequential access stream spill.

The candidate bank is thus selected based on the count of accesses targeted to each bank of the plurality of banks 104 and a plurality of bank-pair distances, with each bank-pair distance indicating a distance between a pair of banks (e.g., an idle bank and an occupied bank) of the plurality of banks 104.

The aforementioned criterion is applicable when all the accesses of the plurality of accesses PAC are data accesses. However, if the plurality of accesses PAC include a set of parity accesses, the selection criterion is modified. In such cases, the refresh circuit 118 may be further configured to identify, from the plurality of accesses PAC, the set of parity accesses. A parity access is typically followed by a data access. Thus, the set of parity accesses may have a set of data accesses associated therewith, respectively. Further, the banks targeted by the parity and data accesses are different. Hence, some of the data accesses may be targeted to idle banks (e.g., the first set of banks). In such a scenario, from the first set of banks, the refresh circuit 118 may be further configured to identify one or more banks targeted for one or more data accesses of the set of data accesses, respectively. The bank-pair distance for each of the one or more banks of the first set of banks is null. In other words, each bank-pair distance that includes such banks as one bank of the pair is null. As a result, the weighted values of such banks are null. Consequently, the candidate bank is selected from remaining banks of the first set of banks. In the above example, if a parity access targeted to the third bank 104c has the following data access targeted to the first bank 104a, the first weighted value may be null and the second bank 104b may be selected as the candidate bank.

All Banks are Occupied:

When all banks are occupied (e.g., when at least one access is targeted to each of the plurality of banks 104), the selection criterion varies. In such a scenario, the refresh circuit 118 may be further configured to determine a data access type scheduled for execution on the DRAM 102. The data access type corresponds to a read access or a write access that the transaction scheduler 112 is scheduling for execution on the DRAM 102. For DRAMs (such as the DRAM 102), the transaction scheduler 112 typically schedules groups of read accesses together and groups of write accesses together to reduce delays associated with switching between write and read accesses. Thus, if the transaction scheduler 112 is scheduling read accesses, a bank having the least number of read accesses targeted thereto may be the most likely candidate for refreshing as the highest performance may be achieved by refreshing such a bank as compared to other banks.

For the sake of ongoing discussion, it is assumed that the data access type scheduled for execution on the DRAM 102 corresponds to a read access. In such a scenario, the candidate bank may be selected from the plurality of banks 104 based on the first data count value of each bank of the plurality of banks 104. The first data count value of each bank indicates the count of read accesses targeted thereto. In an embodiment, the candidate bank corresponds to a bank having the lowest first data count value (e.g., having the first data count value less than the first data count value of each remaining bank of the plurality of banks 104). However, in other embodiments, any other rule may be utilized for selecting the candidate bank from the plurality of banks 104 based on the first data count value of each bank. Thus, the candidate bank is selected based on the count of data accesses targeted to each bank of the plurality of banks 104, with a type of each data access being same as that scheduled for execution on the DRAM 102.

If the aforementioned criterion results in the availability of two or more banks for selection (e.g., two or more banks have the least first data count value), the candidate bank is selected based on the second data count value of each of the two or more banks. The second data count value is indicative of the count of write accesses (e.g., data accesses having a different type from that scheduled for execution on the DRAM 102). In an embodiment, the candidate bank corresponds to a bank having a sum of the first and second data count values less than a sum of the first and second data count values of each remaining bank of the two or more banks. However, in other embodiments, any other rule may be utilized for selecting the candidate bank from the two or more banks based on the first and second data count values.

Example

In an example, it is assumed that the first bank 104a has four read accesses and two write accesses targeted thereto, the second bank 104b has three read accesses and one write access targeted thereto, the third bank 104c has two read accesses and three write accesses targeted thereto, and the fourth bank 104d has two read accesses and one write access targeted thereto. Further, it is assumed that read accesses are scheduled for execution on the DRAM 102. Thus, based on the first data count value, the third and fourth banks 104c and 104d are available for selection. In such a scenario, the second data count value may be utilized for making the selection. Thus, as the fourth bank 104d has the lower count of write accesses, the fourth bank 104d may be selected as the candidate bank.

The aforementioned criterion is applicable when all the accesses of the plurality of accesses PAC are data accesses. However, if the plurality of accesses PAC include one or more parity accesses, the selection criterion is modified. In such cases, the parity accesses are assigned higher priority (e.g., are executed before data accesses). Thus, the refresh circuit 118 may select the candidate bank from the plurality of banks 104 based on the parity count value of each bank of the plurality of banks 104. In an embodiment, the candidate bank corresponds to a bank having the least parity count value (e.g., having the parity count value less than the parity count value of each remaining bank of the plurality of banks 104). However, in other embodiments, any other rule may be utilized for selecting the candidate bank from the plurality of banks 104 based on the parity count value of each bank. Thus, the candidate bank is selected based on the count of parity accesses targeted to each bank of the plurality of banks 104.

If the aforementioned criterion results in the availability of a set of banks for selection (e.g., multiple banks have the least parity count value), the refresh circuit 118 may be further configured to determine the data access type scheduled for execution on the DRAM 102. For the sake of ongoing discussion, it is assumed that the data access type scheduled for execution on the DRAM 102 corresponds to a read access. Thus, the candidate bank may be selected from the plurality of banks 104 based on the first data count value of each bank of the set of banks in a similar manner as described above. In an embodiment, the candidate bank corresponds to a bank having the least first data count value. Further, if two or more banks have the least first data count value, and hence, are available for selection, the candidate bank is selected based on the second data count value of each of the two or more banks. In an embodiment, the candidate bank corresponds to a bank having the sum of the first and second data count values less than the sum of the first and second data count values of each remaining bank of the two or more banks.

Example

In an example, it is assumed that the first bank 104a has one parity access, four read accesses, and two write accesses targeted thereto, the second bank 104b has two parity accesses, three read accesses, and one write access targeted thereto, the third bank 104c has one parity access, two read accesses, and three write accesses targeted thereto, and the fourth bank 104d has one parity access, two read accesses, and one write access targeted thereto. Thus, based on the parity count value, the first, third, and fourth banks 104a, 104c, and 104d are available for selection. Further, it is assumed that read accesses are scheduled for execution on the DRAM 102. In such a scenario, the first data count value may be utilized for making the selection. Based on the first data count value, the third and fourth banks 104c and 104d are available for selection. In such cases, the second data count value may be utilized for making the selection. As the fourth bank 104d has the lower count of write accesses, the fourth bank 104d may be selected as the candidate bank.

FIG. 1 describes that accesses present in both the transaction scheduler 112 and the queuing circuit 114 have equal priority when selecting the candidate bank. However, the scope of the present disclosure is not limited to it. In various other embodiments, the accesses of the queuing circuit 114 may have higher priority than the accesses of the transaction scheduler 112. Thus, while selecting the candidate bank based on the count of data or parity accesses, initially exclusively the accesses of the queuing circuit 114 (e.g., the first set of accesses SA1) may be utilized. If such criterion results in the availability of two or more banks for selection, exclusively then are the accesses of the transaction scheduler 112 (e.g., the second set of accesses SA2) utilized for selecting the candidate bank. Conversely, the accesses of the transaction scheduler 112 may have higher priority than the accesses of the queuing circuit 114.

The refresh circuit 118 may be further configured to trigger the refresh of the candidate bank. To trigger the refresh of the candidate bank, the refresh circuit 118 may execute various operations. For example, the refresh circuit 118 may be further configured to generate a trigger command TG indicative of the refresh of the candidate bank and provide the trigger command TG to the DRAM 102 (e.g., the control circuit 106). The control circuit 106 may refresh the candidate bank based on the trigger command TG. While the candidate bank is being refreshed, the access management circuit 116 may execute various accesses (e.g., the access ACS) on the remaining banks of the plurality of banks. Additionally, the refresh circuit 118 may be further configured to provide first and second indication signals IS1 and IS2 to the transaction scheduler 112 and the queuing circuit 114, respectively, indicating the triggering of the refresh of the candidate bank.

Based on the triggering of the candidate bank for refreshing, the transaction scheduler 112 may be further configured to block (e.g., not schedule) a third set of accesses (not shown) associated with the candidate bank. The accesses are blocked to prevent head-of-line blocking of accesses of remaining banks. Further, in the present disclosure, the transaction scheduler 112 may be configured to schedule the third set of accesses for execution on the candidate bank, a first predefined time duration before the completion of the refresh of the candidate bank. The first predefined time duration may be such that the third set of accesses is available for execution on the candidate bank when the candidate bank is operational post the refresh. The scheduling of the accesses before the bank is out of refresh reduces the latency associated with the accesses as compared to when accesses are scheduled after the refreshed bank is operational.

Each bank of the plurality of banks 104 is selected for refresh based on one of the aforementioned criteria. Thus, each bank is selected based on the count of accesses targeted to each bank and the plurality of bank-pair distances, the count of data accesses targeted to each bank, the count of parity accesses targeted to each bank, or a combination thereof. Each bank-pair distance may indicate a distance between a pair of banks (e.g., an idle bank and an occupied bank) and each data access may have the same type as that scheduled for execution on the DRAM 102.

Exemplary Scenario:

In an exemplary scenario, it is assumed that initially the first and second banks 104a and 104b are idle and the third and fourth banks 104c and 104d are occupied. In such a scenario, the first bank 104a is selected as a first candidate bank based on the count of accesses targeted to each bank of the plurality of banks 104 and the plurality of bank-pair distances. The refresh of the first bank 104a is then triggered. During the refresh of the first bank 104a, various accesses targeting the second bank 104b may be initiated. Thus, all the unrefreshed banks are occupied. In such a scenario, the third bank 104c may be selected as a second candidate bank based on the count of parity accesses targeted to each bank of the plurality of banks 104. The refresh of the third bank 104c may then be triggered. After the third bank 104c is refreshed, the second bank 104b may be selected as a third candidate bank based on the count of data accesses targeted to each bank of the plurality of banks 104, with the type of each data access being the same as that scheduled for execution on the DRAM 102. The refresh of the second bank 104b may then be triggered. After the refresh of the second bank 104b, the last bank (e.g., the fourth bank 104d) may be selected for the refresh. Thus, the first, third, second, and fourth banks 104a, 104c, 104b, and 104d are refreshed in a sequential manner. After each selection, the plurality of banks 104 may correspond to unrefreshed (e.g., yet-to-be-refreshed) banks and one of the aforementioned criteria may be implemented to select the candidate bank for refreshing.

When the candidate bank corresponds to a penultimate bank of the plurality of banks 104 to be refreshed, a single bank is pending refresh. In such a scenario, the transaction scheduler 112 may be further configured to block a fourth set of accesses (not shown) targeted to the last bank, of the plurality of banks 104, that is to be refreshed after the candidate bank. Such blocking of accesses targeted to a bank, whose refresh is imminent, mitigates head-of-line blocking of accesses of other banks in the queuing circuit 114. The transaction scheduler 112 may block the unscheduled fourth set of accesses based on the refresh of the last bank being due in a second predefined time duration, a count of accesses targeted to the last bank in the queuing circuit 114 being greater than a threshold value, or a combination thereof.

Once all the banks of the plurality of banks 104 are refreshed, the refreshing cycle may repeat, with each candidate bank being selected based on the above-described criteria. The refresh of the DRAM 102 may be implemented such that each bank is refreshed within the desired interval (e.g., the refresh interval).

The plurality of banks 104 is shown to include four banks to make the illustrations concise and clear and should not be considered as a limitation of the present disclosure. In various other embodiments, the plurality of banks 104 may include more than or less than four banks, without deviating from the scope of the present disclosure. In such a scenario, each bank may be refreshed in a similar manner as described above.

Although FIG. 1 illustrates that the accesses (such as the access ACS) are executed by way of the access management circuit 116, the scope of the present disclosure is not limited to it. In various other embodiments, IC 108 may be sans the access management circuit 116, and the queuing circuit 114 may directly execute accesses on the DRAM 102.

Each bank of the plurality of banks 104 is described as a single bank element to keep the description concise and clear and should not be considered a limitation of the present disclosure. For low-power double data rate (LPDDR) fifth-generation technology onwards, the bank elements of the DRAM 102 may be grouped (e.g., in pairs). In such cases, pairs of bank elements may be selected for refreshing in one go. Hence, one bank may correspond to one pair of bank elements and attributes of both the bank elements (e.g., access targeted thereto) may be utilized for selecting a candidate bank.

The plurality of banks 104 may constitute a rank. The scope of the present disclosure is not limited to the DRAM 102 including a single rank. In various other embodiments, the DRAM 102 may include multiple ranks, with each rank including multiple banks. In such a scenario, the banks of each rank may be refreshed in a similar manner as described above.

FIGS. 2A-2D, collectively, represents a flowchart 200 that illustrates a method for refreshing the DRAM 102 in accordance with an embodiment of the present disclosure. The DRAM refresh method may be executed by the refresh circuit 118. The refresh circuit 118 may execute the per-bank refresh of the DRAM 102. The refresh circuit 118 may monitor the queuing circuit 114 and the transaction scheduler 112. The refresh circuit 118 may thus determine that the first set of accesses SA1 is present in the queuing circuit 114 and the second set of accesses SA2 is present in the transaction scheduler 112. Each access of the first and second sets of accesses SA1 and SA2 may be targeted to a bank of the plurality of banks 104. Further, each access of the first and second sets of accesses SA1 and SA2 may correspond to a data access or a parity access.

Figure 2A:
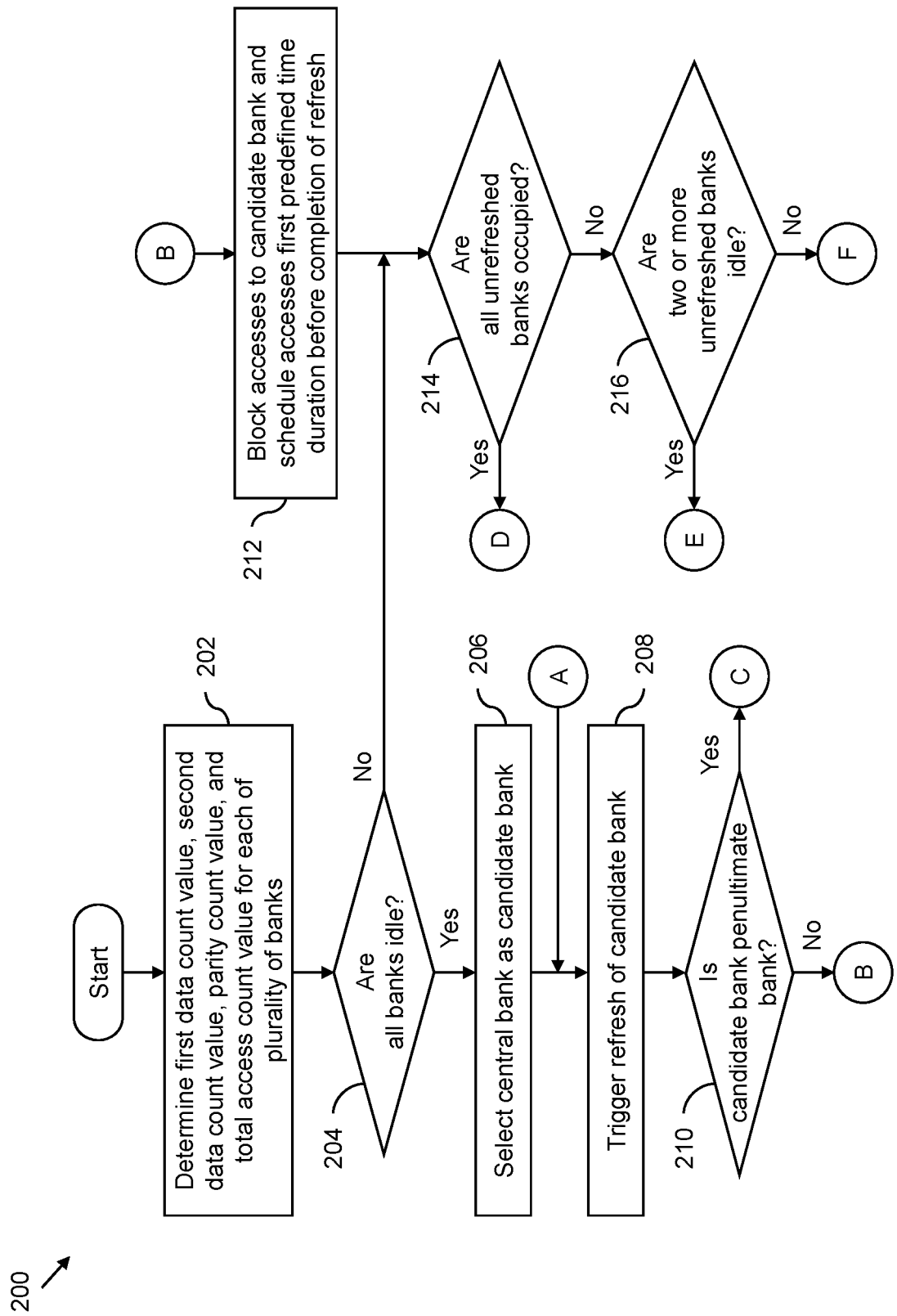

Referring to FIG. 2A, at step 202, the refresh circuit 118 may determine, for each bank of the plurality of banks 104, the first data count value indicating the count of read accesses targeted thereto, the second data count value indicating the count of write accesses targeted thereto, the parity count value indicating the count of parity accesses targeted thereto, and a total access count value indicating the count of accesses targeted thereto. The count of accesses targeted to each bank may correspond to the sum of the first data count value, the second data count value, and the parity count value of each bank. At step 204, the refresh circuit 118 may determine whether all banks of the plurality of banks 104 are idle (e.g., the count of accesses targeted thereto is null). If at step 204, it is determined that all banks are idle, step 206 is performed. At step 206, the refresh circuit 118 may select the central bank as the candidate bank for refreshing. The central bank corresponds to a bank that is at the center position in the linear arrangement of the plurality of banks 104. At step 208, the refresh circuit 118 may trigger the refresh of the candidate bank. At step 210, the transaction scheduler 112 may determine whether the candidate bank is the penultimate bank. If at step 210, it is determined that the candidate bank is not the penultimate bank, step 212 is performed. At step 212, the transaction scheduler 112 may block accesses (e.g., the third set of accesses) to the candidate bank and schedule the accesses, the first predefined time duration before the completion of the refresh. The first predefined time duration may be such that the accesses are available for execution on the candidate bank when the candidate bank is operational post the refresh. Step 214 may be performed after step 212. Further, if at step 204, it is determined that all banks are not idle (e.g., some banks of the plurality of banks 104 are occupied), step 214 is performed.

Figure 2B:
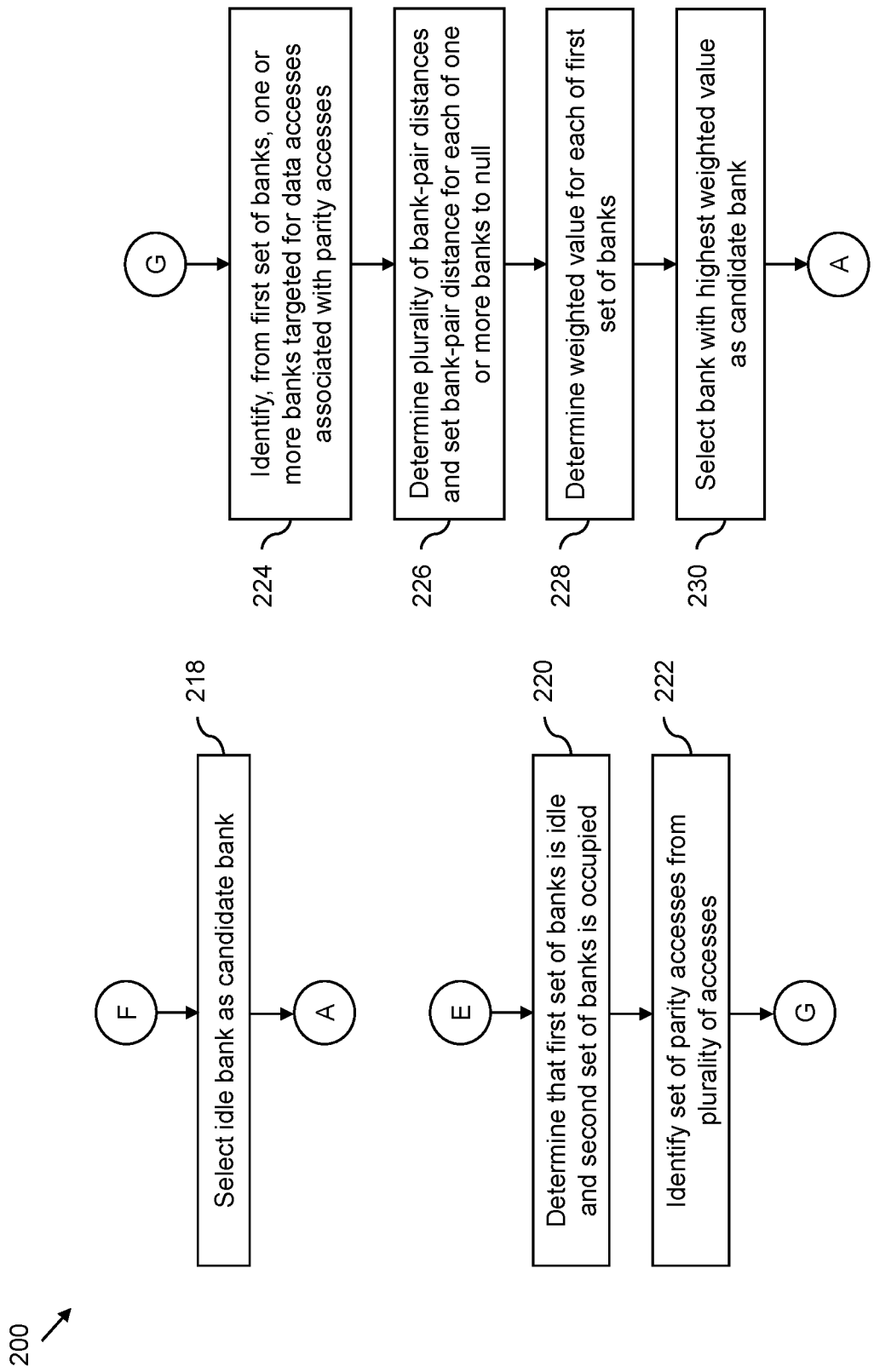

At step 214, the refresh circuit 118 may determine whether all unrefreshed banks (e.g., the plurality of banks 104) are occupied. If at step 214, it is determined that all unrefreshed banks are not occupied (e.g., some unrefreshed banks are idle), step 216 is performed. At step 216, the refresh circuit 118 may determine whether two or more unrefreshed banks are idle. If at step 216, it is determined that exclusively a single bank is idle, step 218 is performed. Referring to FIG. 2B, at step 218, the refresh circuit 118 may select the idle bank as the candidate bank. Step 208 may be performed after step 218.

Referring back to FIG. 2A, if at step 216, it is determined two or more unrefreshed banks are idle, step 220 may be performed. Referring back to FIG. 2B, at step 220, the refresh circuit 118 may determine that the first set of banks is idle and the second set of banks is occupied. At step 222, the refresh circuit 118 may identify, from the plurality of accesses PAC, the set of parity accesses. The set of parity accesses may have the set of data accesses associated therewith, respectively. At step 224, the refresh circuit 118 may identify, from the first set of banks, the one or more banks targeted for data accesses associated with the parity accesses. In other words, the one or more banks may be targeted for the one or more data accesses of the set of data accesses, respectively. At step 226, the refresh circuit 118 may determine the plurality of bank-pair distances and set the bank-pair distance for each of the one or more banks to null. Each bank-pair distance may indicate a distance between one of the first set of banks and one of the second set of banks. Further, each bank-pair distance that includes the one or more banks as one bank of the pair is set as null. At step 228, the refresh circuit 118 may determine the weighted value for each of the first set of banks. At step 230, the refresh circuit 118 may select the bank with the highest weighted value as the candidate bank. Step 208 may be performed after step 230.

The scope of the present disclosure is not limited to the flowchart 200 including steps 222-226. In other embodiments, if the accesses targeted to the second set of banks are exclusively data accesses, steps 222-226 may be omitted.

Figure 2C:
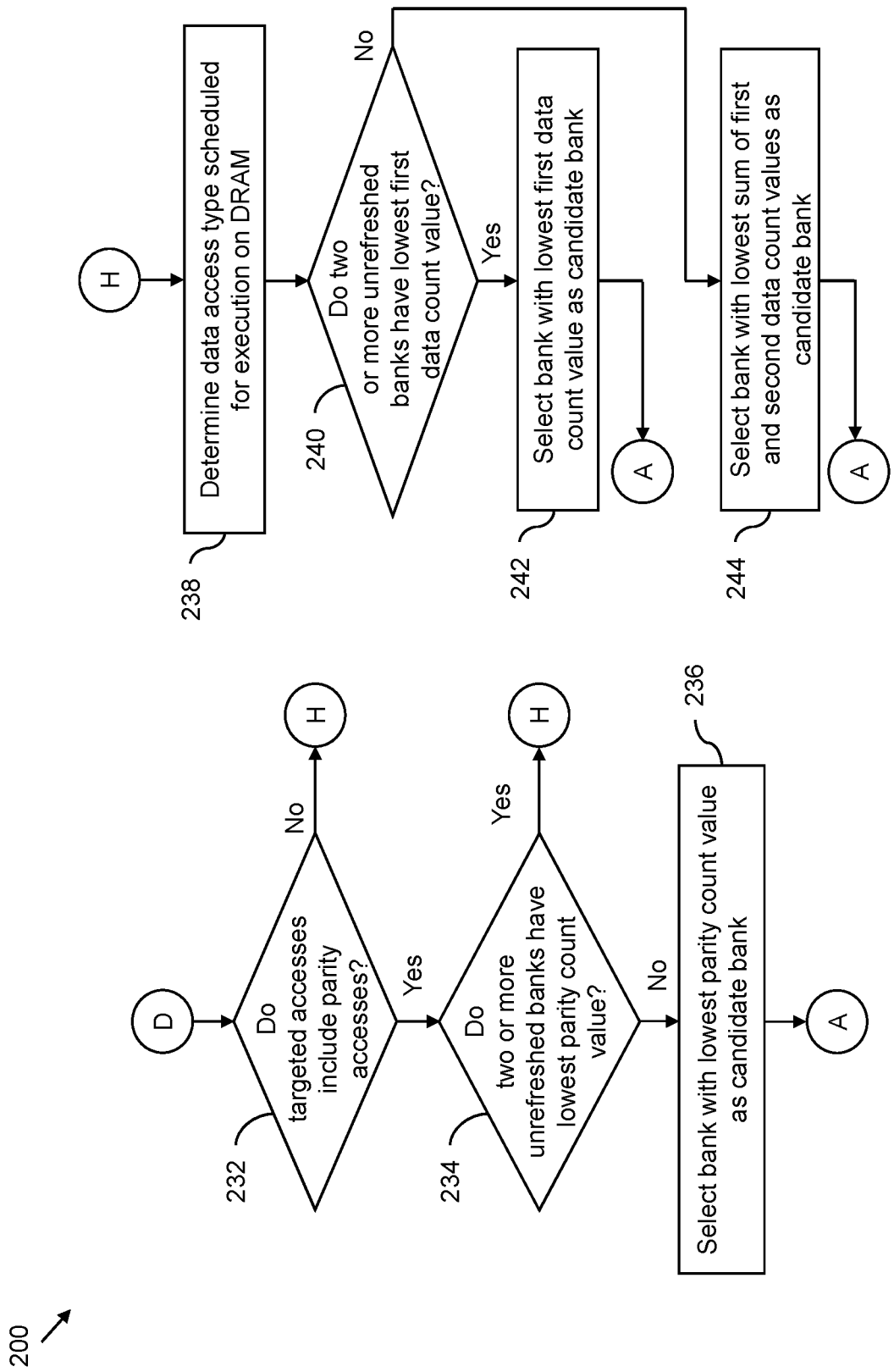

Referring back to FIG. 2A, if at step 214, it is determined that all unrefreshed banks are occupied, step 232 is performed. Referring to FIG. 2C, at step 232, the refresh circuit 118 may determine whether the accesses targeted to the unrefreshed banks include parity accesses. If at step 232, it is determined that the accesses targeted to the unrefreshed banks include parity accesses, step 234 is performed. In such a scenario, the parity count value of each bank may be utilized for selecting the candidate bank. At step 234, the refresh circuit 118 may determine whether two or more unrefreshed banks have the lowest parity count value. If at step 234, it is determined that exclusively a single unrefreshed bank has the lowest parity count value, step 236 is performed. At step 236, the refresh circuit 118 may select the bank with the lowest parity count value as the candidate bank. Step 208 may be performed after step 236. If at step 234, it is determined that two or more unrefreshed banks have the lowest parity count value, step 238 is performed. Additionally, if at step 232, it is determined that the accesses targeted to the unrefreshed banks do not include parity accesses, step 238 is performed. At step 238, the refresh circuit 118 may determine the data access type scheduled for execution on the DRAM 102. For the sake of ongoing discussion, it is assumed that the data access type scheduled for execution on the DRAM 102 corresponds to the read access. Thus, the first data count value may be utilized for selecting the candidate bank.

At step 240, the refresh circuit 118 may determine whether two or more unrefreshed banks have the lowest first data count value. If at step 240, it is determined that exclusively a single unrefreshed bank has the lowest first data count value, step 242 is performed. At step 242, the refresh circuit 118 may select the bank with the lowest first data count value as the candidate bank. Step 208 may be performed after step 242. If at step 240, it is determined that two or more unrefreshed banks have the lowest first data count value, step 244 is performed. Thus, the second data count value may additionally be utilized for selecting the candidate bank. At step 244, the refresh circuit 118 may select the bank with the lowest sum of the first and second data count values as the candidate bank. Step 208 may be performed after step 242.

Each bank of the plurality of banks 104 is selected for refresh based on one of the aforementioned criteria. Referring back to FIG. 2A, if at step 210, it is determined that the candidate bank corresponds to a penultimate bank, step 246 is performed. Referring to FIG. 2D, at step 246, the transaction scheduler 112 may block the accesses targeted to the candidate bank (e.g., the penultimate bank) and schedule the accesses to the candidate bank, the first predefined time duration before the completion of the refresh of the candidate bank. At step 248, the transaction scheduler 112 may block the accesses targeted to the last bank, of the plurality of banks 104, that is to be refreshed after the candidate bank. The transaction scheduler 112 may block the accesses targeted to the last bank during or after the refresh of the penultimate bank, At step 250, the refresh circuit 118 may trigger the refresh of the last bank. At step 252, the transaction scheduler 112 may schedule the accesses to the last bank, the first predefined time duration before the completion of the refresh of the last bank.

Once all the banks of the plurality of banks 104 are refreshed, the refreshing cycle may repeat, with each candidate bank being selected based on the above-described criteria.

Thus, in the present disclosure, the candidate bank triggered for refresh is not merely the first available bank, but is selected based on various criteria. Such a selection assists in maximizing the availability of the DRAM 102. Thus, the performance of the DRAM 102 is significantly greater than that of a DRAM that is refreshed by way of a conventional refresh technique.

While various embodiments of the present disclosure have been illustrated and described, it will be clear that the present disclosure is not limited to these embodiments only. Numerous modifications, changes, variations, substitutions, and equivalents will be apparent to those skilled in the art, without departing from the spirit and scope of the present disclosure, as described in the claims. Further, unless stated otherwise, terms such as "first" and "second" are used to arbitrarily distinguish between the elements such terms describe. Thus, these terms are not necessarily intended to indicate temporal or other prioritization of such elements.

The invention claimed is:

1. An integrated circuit (IC), comprising:
   a refresh circuit configured to (i) select, from a plurality of banks of a dynamic random access memory (DRAM), a candidate bank for refreshing and (ii) trigger the refresh of the candidate bank,
   wherein when a first set of banks of the plurality of banks is idle and a plurality of accesses are targeted to a second set of banks of the plurality of banks, the candidate bank is selected based on (i) a count of accesses targeted to each of the second set of banks and (ii) a plurality of bank-pair distances, with each bank-pair distance indicating a distance between one of the first set of banks and one of the second set of banks, and
   wherein when at least one access is targeted to each of the plurality of banks, the candidate bank is selected based on at least one of a group consisting of (i) a count of data accesses targeted to each bank of the plurality of banks, with a type of each data access being same as that scheduled for execution on the DRAM, and (ii) a count of parity accesses targeted to each bank of the plurality of banks.

2. The IC of claim 1, wherein the refresh circuit is further configured to:
   determine that the first set of banks is idle and the plurality of accesses are targeted to the second set of banks based on a count of accesses targeted to each bank of the plurality of banks, wherein each bank of the first set of banks is determined to be idle based on the count of accesses targeted to the corresponding bank being null; and
   determine a weighted value of each of the first set of banks based on (i) a bank-pair distance between the corresponding bank and each of the second set of banks and (ii) the count of accesses targeted to each of the second set of banks, wherein the candidate bank is selected from the first set of banks based on the weighted value of each of the first set of banks.

3. The IC of claim 2, wherein the weighted value of each bank of the first set of banks corresponds to a sum of a set of product values, with each product value being equal to a product of (i) the bank-pair distance between the corresponding bank and one of the second set of banks and (ii) the count of accesses targeted to the same bank of the second set of banks, and wherein the candidate bank corresponds to a bank having the weighted value greater than the weighted value of each remaining bank of the first set of banks.

4. The IC of claim 2, wherein the refresh circuit is further configured to:
   identify, from the plurality of accesses, a set of parity accesses, wherein the set of parity accesses have a set of data accesses associated therewith; and
   identify, from the first set of banks, one or more banks targeted for one or more data accesses of the set of data accesses, respectively, wherein the bank-pair distance for each of the one or more banks is null and the candidate bank is selected from remaining banks of the first set of banks.

5. The IC of claim 2, further comprising:
   a queuing circuit configured to order a first set of accesses for execution on the second set of banks; and
   a transaction scheduler configured to manage scheduling of a second set of accesses associated with the second set of banks, wherein the plurality of accesses correspond to at least one of a group consisting of the first set of accesses and the second set of accesses.

6. The IC of claim 1, wherein each bank-pair distance corresponds to a circular distance, with the plurality of banks being arranged in a circular manner such that an initial bank of the plurality of banks is adjacent to a last bank of the plurality of banks.

7. The IC of claim 1, wherein when at least one access is targeted to each of the plurality of banks, the refresh circuit is further configured to:
determine a data access type scheduled for execution on the DRAM, wherein the data access type corresponds to one of a group consisting of a read access and a write access; and
determine, for each bank of the plurality of banks, a first data count value indicating the count of data accesses having the same type as that scheduled for execution on the DRAM, wherein the candidate bank is selected from the plurality of banks based on the first data count value of each bank of the plurality of banks.

8. The IC of claim 7, wherein when two or more banks of the plurality of banks are available for selection based on the corresponding first data count value, the candidate bank is selected based on a second data count value of each of the two or more banks, and wherein the second data count value is indicative of a count of data accesses having a different type from that scheduled for execution on the DRAM.

9. The IC of claim 8, wherein the candidate bank corresponds to a bank having one of a group consisting of (i) the first data count value less than the first data count value of each remaining bank of the plurality of banks and (ii) a sum of the first data count value and the second data count value less than a sum of the first data count value and the second data count value of each remaining bank of the two or more banks.

10. The IC of claim 1, wherein when at least one access is targeted to each of the plurality of banks, the refresh circuit is further configured to determine, for each bank of the plurality of banks, a parity count value indicating the count of parity accesses targeted thereto, and wherein the candidate bank is selected from the plurality of banks based on the parity count value of each bank of the plurality of banks.

11. The IC of claim 10, wherein when a set of banks of the plurality of banks is available for selection based on the corresponding parity count value, the refresh circuit is further configured to:
determine a data access type scheduled for execution on the DRAM, wherein the data access type corresponds to one of a group consisting of a read access and a write access; and
determine, for each bank of the plurality of banks, a first data count value indicating the count of data accesses having the same type as that scheduled for execution on the DRAM, wherein the candidate bank is selected from the plurality of banks based on the first data count value of each bank of the plurality of banks.

12. The IC of claim 11, wherein when two or more banks, of the set of banks, are available for selection based on the corresponding first data count value, the candidate bank is selected based on a second data count value of each of the two or more banks, and wherein the second data count value is indicative of a count of data accesses having a different type from that scheduled for execution on the DRAM.

13. The IC of claim 12, wherein the candidate bank corresponds to a bank having one of a group consisting of (i) the parity count value less than the parity count value of each remaining bank of the plurality of banks, (ii) the first data count value less than the first data count value of each remaining bank of the set of banks, and (iii) a sum of the first data count value and the second data count value less than a sum of the first data count value and the second data count value of each remaining bank of the two or more banks.

14. The IC of claim 1, further comprising a transaction scheduler configured to manage access scheduling associated with the plurality of banks, wherein based on the triggering of the candidate bank for refreshing, the transaction scheduler is further configured to block a set of accesses associated with the candidate bank, and schedule the set of accesses for execution on the candidate bank, a predefined time duration before the completion of the refresh of the candidate bank.

15. The IC of claim 14, wherein the predefined time duration is such that the set of accesses is available for execution on the candidate bank when the candidate bank is operational post the refresh.

16. The IC of claim 1, further comprising a transaction scheduler configured to manage access scheduling associated with the plurality of banks, wherein when the candidate bank corresponds to a penultimate bank, of the plurality of banks, to be refreshed, the transaction scheduler is further configured to block an unscheduled set of accesses targeted to a last bank, of the plurality of banks, that is to be refreshed after the candidate bank.

17. The IC of claim 16, further comprising a queuing circuit configured to order a scheduled set of accesses associated with the plurality of banks, wherein the transaction scheduler blocks the unscheduled set of accesses based on at least one of a group consisting of (i) the refresh of the last bank being due in a predefined time duration and (ii) a count of accesses targeted to the last bank in the queuing circuit being greater than a threshold value.

18. The IC of claim 1, wherein to trigger the refresh of the candidate bank, the refresh circuit is further configured to (i) generate a trigger command indicative of the refresh of the candidate bank, and (ii) provide the trigger command to a control circuit of the DRAM, wherein the candidate bank is refreshed based on the trigger command.

19. A dynamic random access memory (DRAM) refresh method, comprising:
selecting, by a refresh circuit, from a plurality of banks of a DRAM, a candidate bank for refreshing, and triggering, by the refresh circuit, the refresh of the candidate bank,
wherein when a first set of banks of the plurality of banks is idle and a plurality of accesses are targeted to a second set of banks of the plurality of banks, the DRAM refresh method further comprises (i) determining, by the refresh circuit, a count of accesses targeted to each of the second set of banks, (ii) determining, by the refresh circuit, a plurality of bank-pair distances, with each bank-pair distance indicating a distance between one of the first set of banks and one of the second set of banks, and (iii) selecting, by the refresh circuit, the candidate bank based on the count of accesses targeted to each of the second set of banks and the plurality of bank-pair distances, and
wherein when at least one access is targeted to each of the plurality of banks, the DRAM refresh method further comprises (i) determining, by the refresh circuit, a count of data accesses targeted to each bank of the plurality of banks, with a type of each data access being same as that scheduled for execution on the DRAM, (ii) determining, by the refresh circuit, a count of parity accesses targeted to each bank of the plurality of banks, and (iii) selecting, by the refresh circuit, the candidate bank based on at least one of a group consisting of the count of data accesses and the count of parity accesses targeted to each bank of the plurality of banks.

20. An integrated circuit (IC), comprising:
a refresh circuit configured to (i) select, from a plurality of banks of a dynamic random access memory (DRAM), a first candidate bank, a second candidate bank, and a third candidate bank for refreshing, and (ii) trigger the refresh of the first candidate bank, the second candidate bank, and the third candidate bank, wherein the first candidate bank is selected based on a count of accesses targeted to each bank of the plurality of banks and a plurality of bank-pair distances, with each bank-pair distance indicating a distance between a pair of banks of the plurality of banks, wherein the second candidate bank is selected based on a count of data accesses targeted to each bank of the plurality of banks, with a type of each data access being same as that scheduled for execution on the DRAM, and wherein the third candidate bank is selected based on a count of parity accesses targeted to each bank of the plurality of banks.

\* \* \* \* \*